(12) United States Patent
Itami et al.

(10) Patent No.: US 9,518,205 B2
(45) Date of Patent: Dec. 13, 2016

(54) UNSATURATED POLYESTER RESIN COMPOSITION AND ENCAPSULATED MOTOR

(71) Applicants: SHOWA DENKO K.K., Tokyo (JP); TOYOTA JIDOSHA KABUSHIKI KAISHA, Aichi (JP)

(72) Inventors: Shotaro Itami, Tokyo (JP); Masashige Tanaka, Tokyo (JP); Hiroyuki Majima, Tokyo (JP); Ryujin Ishiuchi, Tokyo (JP); Hiroaki Sugita, Aichi (JP)

(73) Assignees: SHOWA DENKO K.K., Tokyo (JP); TOYOTA JIDOSHA KABUSHIKI KAISHA, Aichi (JP)

( * ) Notice: Subject to any disclaimer, the term of this patent is extended or adjusted under 35 U.S.C. 154(b) by 140 days.

(21) Appl. No.: 14/358,495

(22) PCT Filed: Dec. 13, 2012

(86) PCT No.: PCT/JP2012/082405
§ 371 (c)(1),
(2) Date: May 15, 2014

(87) PCT Pub. No.: WO2013/089196
PCT Pub. Date: Jun. 20, 2013

(65) Prior Publication Data
US 2014/0332712 A1 Nov. 13, 2014

(30) Foreign Application Priority Data

Dec. 14, 2011 (JP) .................... 2011-273394

(51) Int. Cl.
| | | |
|---|---|---|
| C08F 283/01 | (2006.01) | |
| C09K 5/14 | (2006.01) | |
| H02K 5/02 | (2006.01) | |
| H02K 3/30 | (2006.01) | |
| H02K 5/08 | (2006.01) | |

(52) U.S. Cl.
CPC ............ *C09K 5/14* (2013.01); *C08F 283/01* (2013.01); *H02K 3/30* (2013.01); *H02K 5/02* (2013.01); *H02K 5/08* (2013.01)

(58) Field of Classification Search
CPC .................................................. C08F 283/01
See application file for complete search history.

(56) References Cited

U.S. PATENT DOCUMENTS

| | | | | |
|---|---|---|---|---|
| 4,837,270 A * | 6/1989 | Kraemer | ................. | C08L 67/02 525/27 |
| 5,077,326 A * | 12/1991 | Shibata | ................... | C08L 67/06 523/523 |
| 2002/0042468 A1 | 4/2002 | Choi et al. | | |

FOREIGN PATENT DOCUMENTS

| | | |
|---|---|---|
| JP | 54-62295 | 5/1979 |
| JP | 58-45214 | 3/1983 |
| JP | 62-184054 | 8/1987 |
| JP | 5-306362 | 11/1993 |
| JP | 6-200136 | 7/1994 |
| JP | 10-95904 | 4/1998 |
| JP | 2001-226573 | 8/2001 |
| JP | 2004-115573 | 4/2004 |
| JP | 2005-154747 | 6/2005 |
| JP | 2005-330390 | 12/2005 |
| JP | 2007-146125 | 6/2007 |
| JP | 2009-13340 | 1/2009 |
| JP | 2009-73975 | 4/2009 |
| JP | 2009-77576 | 4/2009 |
| JP | 2009-77577 | 4/2009 |
| JP | 2009-102586 | 5/2009 |
| JP | 2010-150352 | 7/2010 |
| JP | 2011-6542 | 1/2011 |
| JP | 2012-191047 | 10/2012 |

OTHER PUBLICATIONS

Extended European Search Report issued Jun. 10, 2015 in corresponding European Application No. 12857515.6.
International Search Report issued Apr. 2, 2013 in International (PCT) Application No. PCT/JP2012/082405.

\* cited by examiner

*Primary Examiner* — Michael Pepitone
(74) *Attorney, Agent, or Firm* — Wenderoth, Lind & Ponack, L.L.P.

(57) ABSTRACT

The present invention is an unsaturated polyester resin composition comprising an unsaturated polyester (a), a monomer (b) having one polymerizable carbon-carbon double bond, a monomer (c) having two or more of (meth) acrylate groups, a filler (d) having high thermal conductivity, a glass fiber (e), a low profile additive (f), a curing agent (g), and a polymerization inhibitor (h), wherein the ratio by weight of the ingredient (b) to the ingredient (c) is from 50:50 to 75:25 and the unsaturated polyester resin composition comprises 400 to 1400 parts by weight of the ingredient (d) based on the total 100 parts by weight of the ingredients (a), (b), and (c). This unsaturated polyester resin composition has excellent curing properties without losing storage stability which can be used to provide a cured product having a low mold shrinkage ratio and high thermal conductivity.

5 Claims, No Drawings

UNSATURATED POLYESTER RESIN COMPOSITION AND ENCAPSULATED MOTOR

TECHNICAL FIELD

The present invention relates to unsaturated polyester resin compositions and encapsulated motors used in the fields of office automation apparatuses, general industrial machine parts, automobiles, heavy electric machinery, and the like. More specifically, the present invention relates to unsaturated polyester resin compositions used for encapsulating electric and electronic parts such as motors and coils and encapsulated motors produced using the same.

BACKGROUND ART

Unsaturated polyester resin compositions, in particular, bulk molding compounds (BMCs) are used to provide a cured product excellent in dimensional accuracy, mechanical characteristics, and flowability, and thus are widely used as an encapsulating material for motors, coils, power generators, and the like to be used in various fields.

Further, for a product such as a motor whose performance reduced by heat generation is considered a problem, the use of an epoxy resin composition comprising an inorganic filler having high thermal conductivity as an encapsulating material from the viewpoint of improving heat dissipation properties has been known (for example, Patent Document 1).

However, the amount of inorganic filler that can be blended in an epoxy resin composition is smaller than what can be blended in an unsaturated polyester resin composition. Therefore, there are problems in epoxy resin compositions in that cured products having sufficient thermal conductivity cannot be obtained, that they require after-cure, and that a cured product thereof has a high mold shrinkage ratio and therefore is easily cracked. As described above, there are a number of problems in epoxy resin compositions regarding moldability, workability, physical properties of a cured product, and the like as compared to unsaturated polyester resin compositions.

On the other hand, unsaturated polyester resin compositions may be easily kneaded and manufactured with high-load manufacturing equipment, and therefore may be blended with a large amount of an inorganic filler having high thermal conductivity as compared to epoxy resin compositions. Further, unsaturated polyester resin compositions can be subjected to closed molding using a molding machine (for example, an injection molding machine or a transfer molding machine) and a mold and also have an advantage of not requiring any post-processing such as after-cure.

Further, there has been a demand for improvement in curing properties of unsaturated polyester resin compositions so as to achieve an increase in productivity of encapsulated products. To meet the demand above, Patent Documents 2 and 3 disclose unsaturated polyester resin compositions comprising a specific curing agent.

PRIOR ART REFERENCES

Patent Documents

Patent Document 1: JP 2005-330390 A
Patent Document 2: JP 2010-150352 A
Patent Document 3: JP 2011-6542A

SUMMARY OF THE INVENTION

Problems to be Solved by the Invention

However, although the unsaturated polyester resin compositions of Patent Documents 2 and 3 are excellent in curing properties, storage stability thereof has not been fully studied. In fact, some of the unsaturated polyester resin compositions of Patent Documents 2 and 3 did not have satisfactory storage stability because a curing agent having a low degradation temperature was used therein. Further, when the amount of curing agent is reduced to improve storage stability, curing properties are reduced.

The present invention was made to solve the problems described above. An object of the present invention is to provide an unsaturated polyester resin composition having excellent curing properties without losing storage stability which can be used to provide a cured product having a low mold shrinkage ratio and high thermal conductivity.

Another object of the present invention is to provide a cured product, especially an encapsulated motor that can be manufactured with excellent workability and productivity and which has excellent heat dissipation properties.

Means for Solving the Problems

The inventors of this application keenly studied to solve the problems described above. As a result, they found that curing properties can be improved without losing storage stability by adding two kinds of specific monomers at a specific ratio to an unsaturated polyester resin composition to complete the present invention.

Namely, the present invention is as described in [1] to [6] below.

[1] An unsaturated polyester resin composition comprising an unsaturated polyester (a), a monomer (b) having one polymerizable carbon-carbon double bond (hereinafter referred to as "the monofunctional monomer"), a monomer (c) having two or more of (meth)acrylate groups (hereinafter referred to as "the acrylic multi-functional monomer"), a filler. (d) having high thermal conductivity, a glass fiber (e), a low profile additive (f), a curing agent (g), and a polymerization inhibitor (h), wherein the ratio by weight of the ingredient (b) to the ingredient (c) is from 50:50 to 75:25 and the unsaturated polyester resin composition comprises 400 to 1400 parts by weight of the ingredient (d) based on the total 100 parts by weight of the ingredients (a), (b), and (c).

[2] The unsaturated polyester resin composition according to [1], wherein the ingredient (b) is at least one compound selected from the group consisting of styrene, vinyl toluene, and methylstyrene and the ingredient (c) is at least one compound selected from the group consisting of ethylene glycol dimethacrylate and diethylene glycol dimethacrylate.

[3] The unsaturated polyester resin composition according to [1] or [2], wherein the ingredient (d) is at least one compound selected from the group consisting of aluminum hydroxide, magnesium carbonate, aluminum oxide, magnesium oxide, beryllium oxide, aluminum nitride, boron nitride, titanium nitride, silicon carbide, boron carbide, titanium carbide, and titanium boride.

[4] The unsaturated polyester resin composition according to any one of [1] to [3], wherein the ingredient (g) is at least one compound selected from the group consisting of t-butylperoxy-2-ethyl hexanoate, t-hexyl peroxy-2-ethylhexanoate, 1,1,3,3-tetramethylbutylperoxy-2-ethylhexanoate, benzoyl peroxide, 1,1-di-t-butylperoxycyclohexane, 1,1-di-t-hexylperoxycyclohexane, 1,1-di-t-butylperoxy-3,3, 5-trimethylcyclohexane, t-butylperoxy isopropyl carbonate, t-hexylperoxy isopropyl carbonate, t-butyl peroxybenzoate, t-hexyl peroxybenzoate, 1,6-bis(t-butylperoxycarbonyloxy) hexane, dicumyl peroxide, and di-t-butyl peroxide.

[5] An encapsulated motor, produced by encapsulation molding of a motor component with the unsaturated polyester resin composition according to any one of [1] to [4].

[6] A cured product, obtained by curing the unsaturated polyester resin composition according to any one of [1] to [4].

Effects of the Invention

The present invention can provide an unsaturated polyester resin composition having excellent curing properties without losing storage stability which can be used to provide a cured product having a low mold shrinkage ratio and high thermal conductivity. Further, the present invention can provide a cured product, especially an encapsulated motor that can be manufactured with excellent workability and productivity and which has excellent heat dissipation properties.

MODE FOR CARRYING OUT THE INVENTION

The unsaturated polyester resin composition of the present invention comprises the unsaturated polyester (a), the monofunctional monomer (b), the acrylic multi-functional monomer (c), the filler (d) having high thermal conductivity, the glass fiber (e), the low profile additive (f), the curing agent (g), and the polymerization inhibitor (h). The each of the ingredients will be explained below.

Unsaturated Polyester (a)

The unsaturated polyester (a) used in the present invention is not particularly limited and those used as molding materials known in the art may be used. In general, the unsaturated polyester (a) is a compound obtained by subjecting a polyalcohol to polycondensation (esterification) with an unsaturated polybasic acid and/or saturated polybasic acid. A vinyl ester may be used as a portion of the unsaturated polyester (a) as long as the effects of the present invention are not reduced.

The weight average molecular weight (MW) of the unsaturated polyester is not particularly limited, but is preferably 2,000 to 50,000, more preferably 5,000 to 20,000. "Weight average molecular weight" used herein means the value obtained by the measurement of the molecular weight by gel permeation chromatography (Shodex GPC-101 manufactured by Showa Denko K.K.) under the following conditions at ambient temperature and the calculation using a standard polystyrene calibration curve.

Column: LF-804 manufactured by Showa Denko
Column temperature: 40° C.
Sample: tetrahydrofuran solution containing 0.2 wt % of the copolymer
Flow rate: 1 mL/min
Eluent: tetrahydrofuran
Detector: RI-71S The polyalcohol used for the synthesis of the unsaturated polyester is not particularly limited and those known in the art may be used. Examples of the polyalcohol include ethylene glycol, propylene glycol, butanediol, diethylene glycol, dipropylene glycol, triethylene glycol, pentanediol, hexanediol, neopentanediol, hydrogenated bisphenol A, bisphenol A, glycerin, and the like. They may be used alone or in combination.

The unsaturated polybasic acid used for the synthesis of the unsaturated polyester is not particularly limited and those known in the art may be used. Examples of the unsaturated polybasic acid include maleic anhydride, fumaric acid, citraconic acid, itaconic acid, and the like. They may be used alone or in combination.

The saturated polybasic acid used for the synthesis of the unsaturated polyester is not particularly limited and those known in the art may be used. Examples of the saturated polybasic acid include phthalic anhydride, isophthalic acid, terephthalic acid, het acid, succinic acid, adipic acid, sebacic acid, tetrachlorophthalic anhydride, tetrabromophthalic anhydride, endomethylene tetrahydrophthalic anhydride, and the like. They may be used alone or in combination.

The unsaturated polyester can be synthesized by a method known in the art using the materials described above. Each of the conditions for the synthesis should be selected appropriately, depending on the materials used and the amounts thereof, but in general, it is produced by esterification at a temperature of 140 to 230° C. under a stream of an inert gas such as nitrogen at increased or reduced pressure. An esterification catalyst may be used in the esterification reaction as necessary. Examples of the esterification catalyst are those known in the art, including manganese acetate, dibutyl tin oxide, stannous oxalate, zinc acetate, cobalt acetate, and the like. They may be used alone or in combination.

Monofunctional Monomer (b)

The monofunctional monomer used in the present invention is an ingredient which functions, together with the acrylic multi-functional monomer (c), as a crosslinker for the unsaturated polyester. The monofunctional monomer (b) is not particularly limited as long as it has one polymerizable carbon-carbon double bond for the polymerization with the unsaturated polyester. Examples of the monofunctional monomer include styrene, vinyl toluene, methylstyrene, methyl methacrylate, and the like. They may be used alone or in combination.

Acrylic Multi-Functional Monomer (c)

The acrylic multi-functional monomer (c) used in the present invention is an ingredient which functions, together with the monofunctional monomer (b), as a crosslinker for the unsaturated polyester. The acrylic multi-functional monomer (c) is not particularly limited as long as it has two or more (meth)acrylate groups. Examples of the acrylic multi-functional monomer (c) include ethylene glycol di(meth)acrylate, diethylene glycol di(meth)acrylate, polyethylene glycol #200 (#400, #600) di(meth)acrylate, 1,4-butanediol di(meth)acrylate, 1,6-hexanediol di(meth)acrylate, 1,9-nonanediol di(meth)acrylate, trimethylolpropane tri(meth)acrylate, glycerin di(meth)acrylate, 2-hydroxy-3-acryloyloxypropyl (meth)acrylate, triethylene glycol di(meth)acrylate, polyethylene glycol di(meth)acrylate, neopentyl glycol di(meth)acrylate, 1,3-butanediol di(meth)acrylate, 1,10-decanediol di(meth)acrylate, and the like. They may be used alone or in combination. "(Meth)acrylate" used herein means a methacrylate or an acrylate.

The amount of the crosslinker (the total of the ingredients (b) and (c)) formulated in the unsaturated polyester resin composition of the present invention is preferably 25 to 70 wt %, more preferably 35 to 65 wt %, based on the total of the ingredients (a), (b), and (c). If the amount of the crosslinker formulated is less than 25 wt %, workability may be reduced due to an increase in resin viscosity. On the other hand, if it exceeds 70 wt %, a cured product having the desired physical properties may not be obtained.

The ratio by weight of the ingredient (b) to the ingredient (c) is from 50:50 to 75:25, preferably 55:45 to 65:35. If the ratio by weight does not fall within the range, the curing properties or storage stability of the unsaturated polyester resin composition is reduced.

Filler (d) Having High Thermal Conductivity

"Filler having high thermal conductivity" used herein means a filler having a thermal conductivity of 10 W/m·K or higher. In particular, the thermal conductivity is preferably 30 W/m·k or higher in view of increasing the thermal conductivity of the cured product. The upper limit of the thermal conductivity is not particularly limited, but is generally, 200 W/m·K. If the thermal conductivity is less than 10 W/m·K, a cured product having the desired thermal conductivity cannot be obtained. "Thermal conductivity of the filler" used herein means a value at 300 K obtained by a laser flash method in accordance with JIS R1611. If it is difficult to directly measure the thermal conductivity of the filler, it may be presumed from the thermal conductivity of a cured product of an unsaturated polyester resin composition comprising the filler.

Examples of the filler (d) having high thermal conductivity are inorganic fillers including aluminum hydroxide, magnesium carbonate, aluminum oxide, magnesium oxide, beryllium oxide, aluminum nitride, boron nitride, titanium nitride, silicon carbide, boron carbide, titanium carbide, titanium boride, and the like. They may be used alone or in combination.

The filler (d) having high thermal conductivity preferably has an average particle size of 0.5 to 30 μm, more preferably 1 to 20 μm and the particle shape is preferably amorphous or spherical powder so as to uniformly disperse the filler in the unsaturated polyester resin composition.

The amount of the ingredient (d) in the unsaturated polyester resin composition of the present invention is 400 to 1,400 parts by weight, preferably 450 to 900 parts by weight, based on the total 100 parts by weight of the ingredients (a), (b), and (c). If the amount of the ingredient (d) formulated is less than 400 parts by weight, the thermal conductivity of the cured product is reduced. On the other hand, if it exceeds 1,400 parts by weight, in-mold flowability is significantly reduced or it becomes difficult to blend the ingredients in the production of the unsaturated polyester resin composition, due to an increase in viscosity of the unsaturated polyester resin composition.

If a filler other than the filler (d) (such as calcium carbonate, barium sulfate, talc, or silica) is used in place of the ingredient (d), an unsaturated polyester resin composition and a cured product having the desired physical properties cannot be obtained. However, a filler other than the filler (d) may be blended with the ingredient (d) as long as the effects of the present invention are not reduced.

Glass Fiber (e)

The glass fiber (e) used in the present invention is not particularly limited and those used as molding materials and known in the art may be used. The glass fiber (e) is preferably short. More specifically, the glass fiber (e) preferably has a fiber length of 3 mm or less, more preferably 1.5 mm or less. If the fiber length exceeds 3 mm, the in-mold flowability of the unsaturated polyester resin composition may be reduced.

The amount of the ingredient (e) formulated in the unsaturated polyester resin composition of the present invention is not particularly limited, but is preferably 20 to 300 parts by weight, more preferably 50 to 250 parts by weight, based on the total 100 parts by weight of the ingredients (a), (b), and (c). If the amount of the ingredient (e) formulated is less than 20 parts by weight, the mold shrinkage ratio of the cured product may be large. On the other hand, if it exceeds 300 parts by weight, it may be difficult to blend the ingredients in the production of the unsaturated polyester resin composition.

Low Profile Additive (f)

The low profile additive (f) used in the present invention is not particularly limited and those known in the art may be used. Examples of the low profile additive (f) are thermoplastic polymers generally used as low profile additives such as polystyrene, poly(methyl methacrylate), poly(vinyl acetate), saturated polyesters, and styrene-butadiene rubbers. They may be used alone or in combination. Polystyrene is preferably used as the low profile additive (f) from the viewpoint of reducing the shrinkage level.

The amount of the ingredient (f) formulated in the unsaturated polyester resin composition of the present invention is not particularly limited, but is preferably 15 to 50 parts by weight, based on the total 100 parts by weight of the ingredients (a), (b), and (c). If the amount of the ingredient (f) formulated is less than 15 parts by weight, the mold shrinkage ratio of the cured product may be large. On the other hand, if it exceeds 50 parts by weight, the in-mold flowability of the unsaturated polyester resin composition is significantly reduced and the mold is not fully filled with the unsaturated polyester resin composition or an insert component may be damaged.

Curing Agent (g)

The curing agent used in the present invention is not particularly limited and those known in the art may be selected. Examples of the curing agent (g) are organic peroxides such as t-butylperoxy-2-ethylhexanoate, t-hexylperoxy-2-ethylhexanoate, 1,1,3,3-tetramethylbutylperoxy-2-ethylhexanoate, benzoyl peroxide, 1,1-di-t-butylperoxycyclohexane, 1,1-di-t-hexylperoxycyclohexane, 1,1-di-t-butylperoxy-3,3,5-trimethylcyclohexane, t-butylperoxy isopropyl carbonate, t-hexylperoxy isopropyl carbonate, t-butyl peroxybenzoate, t-hexyl peroxybenzoate, 1,6-bis(t-butylperoxycarbonyloxy)hexane, dicumyl peroxide, and di-t-butyl peroxide. They may be used alone or in combination.

The amount of the ingredient (g) formulated in the unsaturated polyester resin composition of the present invention is preferably 0.1 to 10 parts by weight, more preferably 2 to 6 parts by weight, based on the total 100 parts by weight of the ingredients (a), (b), and (c). If the amount of the ingredient (g) formulated is less than 0.1 part by weight, the curing time prolongs or the cure level may be insufficient. On the other hand, if it exceeds 10 parts by weight, storage stability may be reduced.

Polymerization Inhibitor (h)

The polymerization inhibitor (h) used in the present invention is not particularly limited and those known in the art may be used. Examples of the polymerization inhibitor (h) include quinones such as p-benzoquinone, toluquinone, naphthoquinone, phenanthraquinone, and 2,5-diphenyl-p-benzoquinone; hydroquinones such as toluhydroquinone, hydroquinone, tert-butylcatechol, mono-tert-butylhydroquinone, and 2,5-di-tert-butylhydroquinone; hydroquinone monomethyl ethers; and monophenols such as 2,6-di-t-butyl-p-cresol. They may be used alone or in combination. Further, among them, a quinone is preferably used from the viewpoint of suppressing gelation.

The amount of the polymerization inhibitor (g) formulated in the unsaturated polyester resin composition of the present invention is preferably 0.005 to 0.2 part by weight, more preferably 0.01 to 0.1 part by weight based on the total 100 parts by weight of the ingredients (a), (b), and (c). If the amount of the polymerization inhibitor (g) formulated is less than 0.005 part by weight, an unsaturated polyester resin composition having the desired in-mold flowability may not be obtained. On the other hand, if it exceeds 0.2 part by mass, curing time may be prolonged or curing may be insufficient.

The unsaturated polyester resin composition of the present invention may comprise optional ingredients such as a mold release agent, a thickener, and a pigment, as necessary, from the viewpoint of improving various physical properties.

The kinds of mold release agent, thickener, and pigment are not particularly limited and those known in the art may be used. Examples of the mold release agent include stearic acid, zinc stearate, calcium stearate, aluminum stearate, magnesium stearate, and carnauba wax. Examples of the thickener include metal oxides such as magnesium oxide, magnesium hydroxide, calcium hydroxide, and calcium oxide, and isocyanate compounds. They may be used alone or in combination.

The amount of each of the optional ingredients formulated is not particularly limited as long as the effects of the present invention are not reduced.

The unsaturated polyester resin composition of the present invention may be manufactured by blending and kneading the above ingredients in predetermined amounts by a conventional method. For example, the unsaturated polyester resin composition may be obtained by mixing the each of the ingredients in the predetermined amount loaded in a kneader or the like.

The unsaturated polyester resin composition of the present invention has improved curing properties without losing storage stability, and thus can improve workability and productivity in the production of a cured product having a desired shape.

Further, the unsaturated polyester resin composition of the present invention can provide a cured product having a low mold shrinkage ratio and high thermal conductivity, and therefore may be used as an encapsulating material for electrical and electronic parts such as motors and coils.

The method of encapsulating electric and electronic parts is not particularly limited. Electric and electronic parts can be encapsulated by subjecting the unsaturated polyester resin composition of the present invention to molding by a molding method such as compression molding, transfer molding, or injection molding and then curing. More specifically, the unsaturated polyester resin composition of the present invention is subjected to molding in a case where an electric or electronic part is installed by an optional molding method, and then is cured by heating at a predetermined temperature.

The curing conditions may be appropriately selected, depending on the materials used in the unsaturated polyester resin composition of the present invention. In general, the curing temperature is 120 to 160° C. and the curing time is one to 30 minutes.

In particular, the unsaturated polyester resin composition of the present invention can provide a cured product having high thermal conductivity, and thus is best suited as a material for encapsulating motors required to have a high level of heat dissipation properties. Namely, an encapsulated motor, which is produced by encapsulation molding of a motor component with the unsaturated polyester resin composition of the present invention, is excellent in heat dissipation properties and can be produced with excellent workability and productivity.

EXAMPLES

The present invention will be described in detail with reference to examples and comparative examples, but is not limited thereto.

Various physical properties of the unsaturated polyester resin compositions and cured products thereof in the following examples and comparative examples were evaluated as described below.

(1) Curing Properties

A curing test was performed using a curelastometer (WP-type manufactured by JSR Trading Co., Ltd.) to measure a change in torque in a curing process. Then, the time to achieve 10% of the maximum torque (hereinafter, referred to as tc10) and the time to achieve 90% of the maximum torque (hereinafter, referred to as tc90) were evaluated. It should be noted that tc10 is an indicator of gelation time and tc90 is an indicator of mold release time.

Molding in a molding time of 60 seconds or shorter is required in the production of encapsulated motors and the like. Experiments conducted so far revealed that the curing property (tc90) of a mold-releasable product that had been prepared with a molding time of 60 seconds is 30 seconds or shorter. Therefore, tc90 is preferably 30 seconds or shorter.

(2) Shelf Life at 40° C.

In-mold flowability of the unsaturated polyester resin composition that was let stand in 40° C. atmosphere was determined. The time required for the in-mold flowability to be reduced by 10% of the initial value was determined as shelf life at 40° C.

The in-mold flowability was evaluated in accordance with the ASTM method by conducting a spiral flow test using a semicircular spiral flow mold having a cross-section diameter of 3 mm under the conditions of a molding temperature of 150° C., an injection pressure of 10 MPa, an injection time of 30 seconds, a curing time of 90 seconds, and a wall thickness of the mold of 3 mm for the determination of flow length.

As the targeted storage stability in summer is one week, the shelf life at 40° C. is preferably seven days or longer.

(3) Mold Shrinkage Ratio

A shrinkage disk defined in JIS K6911 was subjected to compression molding at a molding temperature of 150° C. under a molding pressure of 10 MPa for a molding time of 3 minutes to calculate a mold shrinkage ratio based on JIS K6911.

Here, as encapsulated motors or the like are used in harsh environments, the mold shrinkage ratio in this evaluation must fall within the range of −0.05 to 0.05%, especially −0.03 to 0.03% from the viewpoint of preventing the occurrence of cracks due to thermal expansion and shrinkage.

(4) Thermal Conductivity

A flat plate measuring 150 mm×150 mm×20 mm was molded by compression molding at a molding temperature of 150° C. under a molding pressure of 10 MPa for a molding time of 3 minutes, and the thermal conductivity thereof was measured by the QTM method (measuring machine: QTM-500 manufactured by Kyoto Electronics Manufacturing Co., Ltd.). As an encapsulated motor or the like must have a high degree of heat dissipation properties, the thermal conductivity in this evaluation is preferably 1.0 W/m·K or more.

(5) Comprehensive Evaluation

Those compositions satisfying all the evaluation standards in evaluations (1) to (4) above were expressed as ○ and those which did not satisfy any of the evaluation standards were expressed as X.

Examples 1-12

100 moles of fumaric acid, 80 moles of propylene glycol, and 20 moles of hydrogenated bisphenol A were put in a four-necked flask equipped with a thermometer, a stirrer, an inert gas inlet, and a reflux condenser. The mixture was heated to a temperature of 200° C. with stirring under a nitrogen gas stream and was subjected to an esterification reaction in accordance with a conventional procedure to obtain an unsaturated polyester. The weight average molecular weight (MW) of the unsaturated polyester measured under the conditions above was 10,000.

An unsaturated polyester resin composition was obtained by kneading the resultant unsaturated polyester and various ingredients listed in Table 1 at a ratio shown in Table 1 by a dual arm kneader. p-Benzoquinone was used as the polymerization inhibitor (h). The units of the amount of each ingredient formulated are expressed as part(s) by weight.

Next, the resultant unsaturated polyester resin compositions and cured products thereof were evaluated for the physical properties described above. Tables 1 shows the results thereof.

TABLE 1

| Ingredients | Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| (a) Unsaturated polyester | 36 | 36 | 36 | 36 | 36 | 36 | 36 | 36 | 36 | 36 | 36 | 36 |
| (b) Styrene | 47 | 41 | 36 | 37 | 47 | 37 | 41 | 41 | 41 | 41 | 41 | 41 |
| (c) Ethylene glycol dimethacrylate | 17 | 23 | 28 | 37 | — | — | — | — | 23 | 23 | 23 | 23 |
| (c) Diethylene glycol dimethacrylate | — | — | — | — | 17 | 37 | — | — | — | — | — | — |
| (c) PEG #200 dimethacrylate | — | — | — | — | — | — | 23 | — | — | — | — | — |
| (c) Trimethylolpropane trimethacrylate | — | — | — | — | — | — | — | 23 | — | — | — | — |
| (d) Aluminum hydroxide (average particle size of 8 μm) | 450 | 450 | 450 | 450 | 450 | 450 | 450 | 450 | 230 | — | — | 410 |
| (d) Aluminum hydroxide crushed (average particle size of 1 μm) | — | — | — | — | — | — | — | — | 370 | 750 | 450 | — |
| (d) Aluminum hydroxide, spherical (average particle size of 10 μm) | — | — | — | — | — | — | — | — | — | — | 900 | — |
| (e) Chopped glass (1.5 mm) | 100 | 100 | 100 | 100 | 100 | 100 | 100 | 100 | 100 | 100 | 100 | 100 |
| (f) Polystyrene | 40 | 40 | 40 | 40 | 40 | 40 | 40 | 40 | 40 | 40 | 40 | 40 |
| (g) t-Butylperoxy-2-ethylhexanoate | 3.5 | 3.5 | 3.5 | 3.5 | 3.5 | 3.5 | 3.5 | 3.5 | 3.5 | 3.5 | 3.5 | 3.5 |
| (h) Polymerization inhibitor | 0.1 | 0.1 | 0.1 | 0.1 | 0.1 | 0.1 | 0.1 | 0.1 | 0.1 | 0.1 | 0.1 | 0.1 |
| Zinc stearate | 15 | 15 | 15 | 15 | 15 | 15 | 15 | 15 | 15 | 15 | 15 | 15 |
| Ratio by weight of (b):(c) | 73:27 | 64:36 | 56:44 | 50:50 | 73:27 | 50:50 | 64:36 | 64:36 | 64:36 | 64:36 | 64:36 | 64:36 |
| Number of parts by weight of (d) with respect to 100 parts by weight of (a) + (b) + (c) | 450 | 450 | 450 | 450 | 450 | 450 | 450 | 450 | 600 | 750 | 1350 | 410 |
| Curing properties tc10 (sec) | 15 | 15 | 14 | 15 | 15 | 15 | 15 | 15 | 14 | 14 | 14 | 15 |
| tc90 (sec) | 26 | 23 | 22 | 23 | 29 | 24 | 24 | 27 | 23 | 23 | 23 | 23 |
| Shelf life at 40° C. (days) | 12 | 12 | 12 | 12 | 12 | 12 | 12 | 12 | 12 | 12 | 12 | 12 |
| Mold shrinkage ratio (%) | −0.02 | 0.00 | 0.01 | 0.04 | −0.03 | 0.03 | −0.03 | 0.00 | −0.02 | −0.03 | −0.02 | 0.01 |
| Thermal conductivity (W/m · K) | 1.3 | 1.3 | 1.3 | 1.3 | 1.2 | 1.3 | 1.2 | 1.3 | 1.4 | 1.6 | 2.8 | 1.1 |
| Comprehensive evaluation | ○ | ○ | ○ | ○ | ○ | ○ | ○ | ○ | ○ | ○ | ○ | ○ |

Comparative Examples 1-10

The unsaturated polyester used in Examples 1 to 12 and ingredients listed in Table 2 were kneaded at the ratio shown in Table 2 using a dual arm kneader to obtain an unsaturated polyester resin composition. p-Benzoquinone was used as the polymerization inhibitor (h). The unit of the amount of ingredients each formulated is expressed as part(s) by weight.

Next, the resultant unsaturated polyester resin compositions and cured products thereof were evaluated for the physical properties described above. Table 2 shows the results thereof.

TABLE 2

| Ingredients | Comparative Examples | | | | | | | | | |
|---|---|---|---|---|---|---|---|---|---|---|
| | 1 | 2 | 3 | 4 | 5 | 6 | 7 | 8 | 9 | 10 |
| (a) Unsaturated polyester | 36 | 36 | 36 | 36 | 36 | 36 | 36 | 36 | 36 | 36 |
| (b) Styrene | 64 | 17 | — | 17 | — | 41 | 41 | 64 | 64 | 64 |
| (c) Ethylene glycol dimethacrylate | — | 47 | 64 | — | — | 23 | 23 | — | — | — |
| (c) Diethylene glycol dimethacrylate | — | — | — | 47 | 64 | — | — | — | — | — |
| (d) Aluminum hydroxide (average particle size of 8 μm) | 450 | 450 | 450 | 450 | 450 | 385 | — | 450 | 450 | 450 |

TABLE 2-continued

| Ingredients | Comparative Examples | | | | | | | | | |
|---|---|---|---|---|---|---|---|---|---|---|
| | 1 | 2 | 3 | 4 | 5 | 6 | 7 | 8 | 9 | 10 |
| (d) Spherical aluminum (average particle size of 10 μm) | — | — | — | — | — | — | 1500 | — | — | — |
| (e) Chopped glass (1.5 mm) | 100 | 100 | 100 | 100 | 100 | 100 | 100 | 100 | 100 | 100 |
| (f) Polystyrene | 40 | 40 | 40 | 40 | 40 | 40 | 40 | 40 | 40 | 40 |
| (g) t-Butylperoxy-2-ethylhexanoate | 3.5 | 3.5 | 3.5 | 3.5 | 3.5 | 3.5 | 3.5 | 7 | 7 | — |
| (g) 1,1,3-3-tetramethylbutylperoxy-2-ethylhexanoate | — | — | — | — | — | — | — | — | — | 3.5 |
| (h) Polymerization inhibitor | 0.1 | 0.1 | 0.1 | 0.1 | 0.1 | 0.1 | 0.1 | 0.1 | 0.3 | 0.1 |
| Zinc stearate | 15 | 15 | 15 | 15 | 15 | 15 | 15 | 15 | 15 | 15 |
| Ratio by weight of (b):(c) | 100:0 | 27:73 | 0:100 | 27:73 | 0:100 | 64:36 | 64:36 | 100:0 | 100:0 | 100:0 |
| Number of parts by weight of (d) with respect to 100 parts by weight of (a) + (b) + (c) | 450 | 450 | 450 | 450 | 450 | 385 | 1500 | 450 | 450 | 450 |
| Curing properties    tc10 (sec) | 16 | 15 | 15 | 15 | 15 | 14 | Note 1 | 13 | 21 | 14 |
| tc90 (sec) | 53 | 55 | 62 | 52 | 56 | 23 | | 26 | 45 | 28 |
| Shelf life at 40° C. (days) | 12 | 12 | 12 | 12 | 12 | 12 | | 5 | 13 | 5 |
| Mold shrinkage ratio (%) | −0.07 | 0.09 | 0.15 | 0.09 | 0.14 | 0.02 | | −0.08 | −0.06 | −0.07 |
| Thermal conductivity (W/m · K) | 1.2 | 1.4 | 1.5 | 1.4 | 1.4 | 0.8 | | 1.2 | 1.2 | 1.2 |
| Comprehensive evaluation | x | x | x | x | x | x | x | x | x | x |

(Note 1)
The values of the physical properties could not be measured because kneading was not possible.

As shown in the results of Tables 1 and 2, the unsaturated polyester resin compositions of Examples 1 to 12 each showed a short mold release time (tc90) and a long shelf life at 40° C. Namely, the unsaturated polyester resin compositions of Examples 1 to 12 were excellent in storage stability and curing properties. In addition, the cured products obtained using the unsaturated polyester resin compositions of Examples 1 to 12 were also excellent in thermal conductivity and mold shrinkage ratio.

On the other hand, as shown in Table 2, if the ratio by weight of the ingredient (b) to the ingredient (c) does not fall within the predetermined range, the mold release time (tc90) became longer or the shelf life at 40° C. became shorter (Comparative Examples 1 to 5 and 8 to 10). Namely, either the storage stability or curing properties of these unsaturated polyester resin compositions were not satisfactory. In addition, if the amount of the ingredient (d) formulated does not fall within the predetermined range, the thermal conductivity of the cured product was reduced or kneading was not possible (Comparative Examples 6 to 7).

As is clear from the results above, the present invention can provide an unsaturated polyester resin composition having excellent curing properties without losing storage stability which can be used to provide a cured product having a low mold shrinkage ratio and a high thermal conductivity. Further, the present invention can provide a cured product, especially an encapsulated motor that can be manufactured with excellent workability and productivity and has excellent heat dissipation properties.

This international application claims priority based on Japanese Patent Application No. 2011-273394 filed on Dec. 14, 2011 and the content thereof is incorporated into this international application in its entirety.

The invention claimed is:

1. An unsaturated polyester resin composition comprising:
    an unsaturated polyester (a),
    styrene (b),
    one or more monomers (c) selected from the group consisting of ethylene glycol dimethacrylate, diethylene glycol dimethacrylate, PEG #200 dimethacrylate and trimethylolpropane trimethacrylate,
    aluminum hydroxide and/or aluminum oxide (d),
    a glass fiber (e),
    a low profile additive (f),
    a curing agent (g), and
    a polymerization inhibitor (h),
    wherein the ratio by weight of the ingredient (b) to the ingredient (c) is from 50:50 to 73:27 and the unsaturated polyester resin composition comprises 400 to 1350 parts by weight of the ingredient (d) based on the total 100 parts by weight of the ingredients (a), (b), and (c).

2. The unsaturated polyester resin composition according to claim 1, wherein the ingredient (g) is at least one compound selected from the group consisting of t-butylperoxy-2-ethylhexanoate, t-hexylperoxy-2-ethylhexanoate, 1,1,3,3-tetramethylbutylperoxy-2-ethylhexanoate, benzoyl peroxide, 1,1-di-t-butylperoxycyclohexane, 1,1-di-t-hexylperoxycyclohexane, 1,1-di-t-butylperoxy-3,3,5-trimethylcyclohexane, t-butylperoxy isopropyl carbonate, t-hexylperoxy isopropyl carbonate, t-butyl peroxybenzoate, t-hexyl peroxybenzoate, 1,6-bis(t-butylperoxycarbonyloxy)hexane, dicumyl peroxide, and di-t-butyl peroxide.

3. An encapsulated motor, produced by encapsulation molding of a motor component with the unsaturated polyester resin composition according to claim 1.

4. A cured product, obtained by curing the unsaturated polyester resin composition according to claim 1.

5. The unsaturated polyester resin composition according to claim 1, wherein the ratio by weight of the ingredient (b) to the ingredient (c) is from 55:45 to 65:35.

* * * * *